(12) United States Patent
Funao

(10) Patent No.: US 7,880,252 B2
(45) Date of Patent: Feb. 1, 2011

(54) SOLID-STATE IMAGE CAPTURING DEVICE, SOLID-STATE IMAGE CAPTURING APPARATUS, AND ELECTRONIC INFORMATION DEVICE

(75) Inventor: Daisuke Funao, Okayama (JP)

(73) Assignee: Sharp Kabushiki Kaisha, Osaka (JP)

( * ) Notice: Subject to any disclaimer, the term of this patent is extended or adjusted under 35 U.S.C. 154(b) by 290 days.

(21) Appl. No.: 12/152,436

(22) Filed: May 13, 2008

(65) Prior Publication Data

US 2009/0079019 A1    Mar. 26, 2009

(30) Foreign Application Priority Data

May 14, 2007    (JP)    ............................... 2007-128667

(51) Int. Cl.
*H01L 31/0232*    (2006.01)
(52) U.S. Cl. ....................... 257/432; 257/431; 257/434; 257/E31.127
(58) Field of Classification Search ................. 257/432, 257/E31.127
See application file for complete search history.

(56) References Cited

FOREIGN PATENT DOCUMENTS

| JP | 2600250 | 4/1997 |
|---|---|---|
| JP | 2003-18473 | 1/2003 |
| JP | 2004-228645 | 8/2004 |

OTHER PUBLICATIONS

Translation of JP-2003-18476A.*
Chinese Office Action dated Oct. 9, 2009 (English Translation also included).

* cited by examiner

*Primary Examiner*—N Drew Richards
*Assistant Examiner*—Mamadou Diallo
(74) *Attorney, Agent, or Firm*—Edwards Angell Palmer & Dodge LLP; David G. Conlin; David A. Tucker

(57) ABSTRACT

A solid-state image capturing device is provided. In the solid-state image capturing device, at least any of openings of electrode wiring layers, color filters and microlenses are provided on a light incident side above light receiving elements as a light receiving region in which the plurality of light receiving elements are disposed on a semiconductor substrate or a semiconductor region provided on a substrate, wherein a shift amount of at least any of the openings of the electrode wiring layers, the color filters and the microlenses in relation to the light receiving elements or in relation to a standard position where a light flux is desired to pass through is calculated by Snell's law based on an incident angle $\theta_0$ of a light flux entering the light receiving region to a surface of the solid-state image capturing device.

52 Claims, 15 Drawing Sheets

US 7,880,252 B2

SOLID-STATE IMAGE CAPTURING DEVICE, SOLID-STATE IMAGE CAPTURING APPARATUS, AND ELECTRONIC INFORMATION DEVICE

This Nonprovisional Application claims priority under 35 U.S.C. §119(a) on Patent Application No. 2007-128667 filed in Japan on May 14, 2007, the entire contents of which are hereby incorporated by reference.

BACKGROUND OF THE INVENTION

1. Field of the Invention

The present invention relates to a solid-state image capturing device, such as a CCD image sensor and a CMOS image sensor, provided with at least any of openings of electrode wiring layers, color filters and microlenses above a plurality of light receiving elements as an image capturing region, for taking an image light from a subject by the plurality of light receiving elements; a solid-state image capturing apparatus provided with the solid-state image capturing device and an image capturing optical system in front of the solid-state image capturing device; and an electronic information device having, for example, a digital camera (e.g., digital video camera, digital still camera), an image input camera, a scanner, a facsimile and a cell phone device equipped with a camera, using the solid-state image capturing device or the solid-state image capturing apparatus as an image input device in the image capturing section.

2. Description of the Related Art

It has been conventionally known that a microlens array is arranged on a light incident side of a plurality of light receiving elements and an incident light is focused on the light receiving elements, so that the amount of unused light is decreased and the focusing rate is improved.

On the other hand, with respect to a characteristic of an output angle of an image capturing optical system, it is known that a chief ray enters from a normal direction to a light receiving region surface along an optical axis at the center of the light receiving region of a solid-state image capturing device while the chief ray enters the periphery (other than the center) of the light receiving region at an angle (at a tilt). Herein, the chief ray is defined as a light that passes through the center of an aperture stop in an image capturing optical system. If there is no aperture stop provided, the chief ray is defined as a light that passes through the center of a lens.

FIG. 8 is a plane view showing an effective pixel region of a conventional solid-state image capturing device, using a UXGA as an example.

In FIG. 8, the effective pixel region 100 of the conventional solid-state image capturing device is a rectangle. In a case where the solid-state image capturing device is, for example, a UXGA, the UXGA has a large number of light receiving elements with effective pixels of 1200 (row)×1600 (column). When the center (an intersection point on diagonal lines) of the effective pixel region 100 is defined as an image height of "0", the four corners of the rectangle effective pixel region 100 can be defined as an image height of "100%". Therefore, the image height indicates how far away the light ray is from the center in a concentric fashion. The image height of "0" of the effective pixel region exists on the optical axis as long as variation arises at the time of manufacturing or a special use is assumed.

FIG. 9 is a longitudinal cross sectional view of an essential structure showing a state where a chief ray is entering with an incident angle into an image capturing region of the solid-state image capturing device in FIG. 8.

In FIG. 9, the chief ray enters the effective pixel region 100 through a lens 101 functioning as an image capturing optical system. At that time, light 102, which enters the lens 101 from the optical axis direction, enters the center of the effective pixel region 100, and light 103, which enters being tilted from the optical axis, enters the periphery of the effective pixel region 100. Herein, the angle with the most intense amount of light entering the image capturing optical system is defined as the incident angle of the chief ray. The incident angle (CRA; chief ray angle) to the effective pixel region 100 increases its gradient as the angle moves from the center of the efficient pixel region 100 to the periphery thereof. The chief ray incident angle also changes depending on the type of the lens 101. In FIG. 9, there is only one lens, but there could be a case where more than one lens is used. The shape of the lens includes not only a spherical shape but also a combination of a spherical shape and an aspherical shape of a few lenses, or only an aspherical shape. Therefore, various characteristics for the chief ray incident angle exist depending on the lens 101. An exemplary chief ray incident angle is schematically shown in FIG. 10. The chief ray enters at the angle shown in FIG. 10 towards the image height of the effective pixel region 100 of the solid-state image capturing device in FIG. 8.

Because the chief ray incident angle tilts more as it moves from the center of the efficient pixel region (light receiving region) 100 to the periphery thereof, Reference 1, for example, discloses a method for arranging microlenses in such a manner that, as going farther from the center portion of the light receiving region 100, the arrangement pitch of the microlenses in the light receiving region 100 gradually becomes smaller than the arrangement pitch of the light receiving elements, and thereby the microlenses come near towards the side of the center portion, so that the focusing rate increases. This is shown in FIG. 11.

FIG. 11 is a graph showing a shift amount in relation to a light receiving element of a microlens as well as a relationship between an arrangement pitch of a microlens and an image height with respect to a conventional solid-state image capturing apparatus disclosed in Reference 1.

As shown in FIG. 11, the shift amount of the microlenses in relation to the light receiving elements is set to be gradually larger as going farther from the center portion (image height "0") of the light receiving region 100 according to the conventional solid-state image capturing apparatus. On the contrary, the arrangement pitch of the microlenses is set to be gradually smaller as going farther from the center portion (image height "0") of the light receiving region 100. As a result, an incident light (subject light) which enters off to the side at the periphery of the light receiving region 100 is focused on the light receiving elements, thereby implementing shading correction.

However, various lenses with different characteristics as output characteristics of an image capturing optical system (an aspherical lens shown in FIG. 12 as an example) are used in accordance with the use of the solid-state image capturing apparatus in recent years. Therefore, lenses with a chief ray characteristic, as shown in FIG. 13, in which, as the image height increases from an image height 0 to a certain image height, the incident angle increases, after which it decreases, are used more often; and it is insufficient to merely use a method for arranging microlenses in such a manner that the arrangement pitch of the microlenses gradually becomes smaller than the arrangement pitch of the light receiving elements.

Accordingly, Reference 2, for example, discloses a method for increasing the arrangement pitch of microlenses in a part from the center portion to a predetermined position of the periphery portion and decreasing the arrangement pitch in a part from the predetermined position of the periphery portion to the outer side. This is shown in FIG. 14.

FIG. 14 is a graph showing a shift amount of a microlens in relation to a light receiving element as well as a relationship between an arrangement pitch of a microlens and an image height with respect to a conventional solid-state image capturing apparatus disclosed in Reference 2. In FIG. 14, the vertical axis indicates a shift amount of microlenses in relation to the light receiving elements as well as an arrangement pitch of microlenses, while the transversal axis indicates an image height.

As shown in FIG. 14, the conventional solid-state image capturing apparatus is set in such a manner that the shift amount of the microlenses in relation to the light receiving elements becomes gradually larger as the distance increases from the center (image height "0") of the light receiving region 100, while the arrangement pitch of the microlenses is set to become gradually smaller between the center portion and the periphery portion with the 80% of the image height in the light receiving region 100. Next, on the contrary with respect to the periphery portion that is further away past the point of image height 80%, the shift amount of the microlenses in relation to the light receiving elements is set to become gradually smaller as the distance increases from the center (image height 0%), while the arrangement pitch of the microlenses is set to become gradually larger. This configuration is said to make a correction for shading possible even in a case where an output angle of a chief ray from an image capturing optical system does not simply increase as an image height from an optical axis increases.

Reference 1: Japanese patent No. 2600250
Reference 2: Japanese Laid-Open Publication No. 2004-228645

SUMMARY OF THE INVENTION

The conventional solid-state image capturing apparatuses described above, however, have the following problems.

The conventional solid-state image capturing apparatus disclosed in Reference 1 has a correction effect for a shading characteristic only in a case where the output angle of the light flux (incident angle of the light flux) proportionally increases in relation to the image height. However, the correction effect is not effective when the shift amount does not constantly increase as the output angle of the chief ray from an image capturing optical system, or the image height, increases (in a case, for example, where the aspherical lens shown in FIG. 12 is used as an image capturing optical system).

Next, unlike the conventional solid-state image capturing apparatus disclosed in Reference 1, the conventional solid-state image capturing apparatus disclosed in Reference 2 is able to reflect output angles of image capturing optical systems (the aspherical lens shown in FIG. 12 as an example) that have been broadly used in recent years. However, the following problems still remain.

First, with respect to the arrangement of microlenses, it is understood that the conventional solid-state image capturing apparatus is able to use the aspherical lens shown as an example in FIG. 12 if the shift amount of the microlenses is increased as the image height increases and then the shift amount is decreased. However, the corresponding relationship between the output angle of an image capturing optical system and the microlenses is not specifically defined so as to show the optimal arrangement for the microlenses, and therefore there is a possibility for color shading or luminance shading to occur.

In addition, the problem with respect to the arrangement of microlenses is how they can be continuously arranged, and it is not practical to determine an optimal shift amount for each pixel at the time of designing for a light receiving element with many pixels. Therefore, there is a possibility of color shading (for example, any of red, green and blue becomes weak) or luminance shading (the perimeter section of a screen becomes dark). If the arrangement between microlenses and light receiving elements slip out of place, an image on a display screen becomes discontinuous and obviously the display quality decreases.

Further, the output angle (incident angle) is changed depending on the type of the image capturing optical system. If the image capturing optical system used is altered even slightly every time the output angle of the image capturing optical system is changed, the arrangement of the microlenses must be re-designed from the beginning and it is disadvantageous in regards to design time.

The present invention is intended to solve the conventional problems described above. The objective of the present invention is to provide a solid-state image capturing device, a solid-state image capturing apparatus provided with the solid-state image capturing device, and an electronic information device using the solid-state image capturing device or the solid-state image capturing apparatus as an image input device in an image capturing section, where the shift amount of microlenses in relation to light receiving elements is expressed as a function, which depends on an incident angle, based on optics in order to prevent color shading and luminance shading due to the output angle of image capturing optical systems and to improve the display quality, so that microlenses can be continuously arranged in a light receiving region and the function can be re-used to shortening a designing period and lowering a designing cost.

A solid-state image capturing device according to the present invention includes at least any of openings of electrode wiring layers, color filters and microlenses provided on a light incident side above light receiving elements as a light receiving region in which the plurality of light receiving elements are disposed on a semiconductor substrate or a semiconductor region provided on a substrate, wherein a shift amount of at least any of the openings of the electrode wiring layers, the color filters and the microlenses in relation to the light receiving elements or in relation to a standard position where a light flux is desired to pass through is calculated by Snell's law based on an incident angle $\theta_0$ of a light flux entering the light receiving region to a surface of the solid-state image capturing device, and a refractive index $n_k$ and a film thickness $t_k$ of each layer above the light receiving elements that configures the light receiving region, so that at least any of the openings of the electrode wiring layers, the color filters, and the microlenses are shifted in relation to the plurality of light receiving elements or in relation to in relation to the standard position where the light flux is desired to pass through so as to be arranged in the light receiving region, thereby achieving the objective described above.

Preferably, in a solid-state image capturing device according to the present invention, the standard position where the light flux is desired to pass through is at any one of an upper most layer, an intermediate layer and an lower most layer of the openings of the electrode wiring layers as well as a center of pixels on the substrate and a center of a photoelectric conversion device.

Still preferably, in a solid-state image capturing device according to the present invention, a correcting coefficient for each layer above the light receiving elements that configures the light receiving region is determined as $a_k$ and the shift amount is calculated by:

$\theta_k = \arcsin((\sin \theta_0) n_0 / n_k)$ $n_0 = 1$ provided that a medium is air, the shift amount $= \Sigma_k a_k \times t_k \times \tan \theta_k$.

Still preferably, in a solid-state image capturing device according to the present invention, a correcting coefficient for each layer above the light receiving elements that configures the light receiving region is determined as $a_k$ and the shift amount is approximately calculated by:

the shift amount $= \Sigma_k a_k \times \sin \theta_0$.

Still preferably, in a solid-state image capturing device according to the present invention, a correcting coefficient for a thick film layer above the light receiving elements that configures the light receiving region is determined as $a_{k1}$ and the shift amount through the thick film layer is calculated by:

$\theta_k = \arcsin((\sin \theta_0) n_0 / n_k)$ $n_0 = 1$ provided that a medium is air the shift amount $= \Sigma_k a_{k1} \times t_k \times \tan \theta_k$, and a correcting coefficient for a thin film layer above the light receiving elements that configure the light receiving region is determined as $a_{k2}$ and the shift amount through the thin film layer is approximately calculated by:

the shift amount $= \Sigma_{k2} a_{k2} \times \sin \theta_0$.

Still preferably, in a solid-state image capturing device according to the present invention, a correcting coefficient for each layer above the light receiving elements that configures the light receiving region is defined as $a_k$ and the incident angle $\theta_0$ is defined as a specific angle between an upper ray and a lower ray of an incident light, and the shift amount is calculated by:

$\theta_k = \arcsin((\sin \theta_0) n_0 / n_k)$ $n_0 = 1$ provided that a medium is air the shift amount $= \Sigma_k a_k \times t_k \times \tan \theta_k$.

Still preferably, in a solid-state image capturing device according to the present invention, a correcting coefficient for each layer above the light receiving elements that configures the light receiving region is defined as $a_k$ and the incident angle $\theta_0$ is defined as a specific angle between an upper ray and a lower ray of an incident light, and the shift amount is approximately calculated by:

the shift amount $= \Sigma_k a_k \times \sin \theta_0$.

Still preferably, in a solid-state image capturing device according to the present invention, a correcting coefficient for each layer above the light receiving elements that configures the light receiving region is defined as $a_k$ and the incident angle $\theta_0$ is defined as an intermediate angle between an upper ray and a lower ray of an incident light, and the shift amount is calculated by:

$\theta_k = \arcsin((\sin \theta_0) n_0 / n_k)$ $n_0 = 1$ provided that a medium is air the shift amount $= \Sigma_k a_k \times t_k \times \tan \theta_k$.

Still preferably, in a solid-state image capturing device according to the present invention, a correcting coefficient for each layer above the light receiving elements that configures the light receiving region is defined as $a_k$ and the incident angle $\theta_0$ is defined as an intermediate angle between an upper ray and a lower ray of an incident light, and the shift amount is approximately calculated by:

the shift amount $= \Sigma_k a_k \times \sin \theta_0$.

Still preferably, in a solid-state image capturing device according to the present invention, a correcting coefficient for each layer above the light receiving elements that configures the light receiving region is defined as $a_k$ and the incident angle $\theta_0$ is defined as an intermediate angle between an intermediate angle from an upper ray to a lower ray and a chief ray of the incident light, and the shift amount is calculated by:

$\theta_k = \arcsin((\sin \theta_0) n_0 / n_k)$ $n_0 = 1$ provided that a medium is air the shift amount $= \Sigma_k a_k \times t_k \times \tan \theta_k$.

Still preferably, in a solid-state image capturing device according to the present invention, a correcting coefficient for each layer above the light receiving elements that configures the light receiving region is defined as $a_k$ and the incident angle $\theta_0$ is defined as an intermediate angle between an intermediate angle from an upper ray to a lower ray and a chief ray of the incident light, and the shift amount is approximately calculated by:

the shift amount $= \Sigma_k a_k \times \sin \theta_0$.

Still preferably, in a solid-state image capturing device according to the present invention, a correcting coefficient for each layer above the light receiving elements that configures the light receiving region is defined as $a_k$ and the incident angle $\theta_0$ is defined as an angle of a chief ray, and the shift amount is calculated by:

$\theta_k = \arcsin((\sin \theta_0) n_0 / n_k)$ $n_0 = 1$ provided that a medium is air the shift amount $= \Sigma_k a_k \times t_k \times \tan \theta_k$.

Still preferably, in a solid-state image capturing device according to the present invention, a correcting coefficient for each layer above the light receiving elements that configures the light receiving region is defined as $a_k$ and the incident angle $\theta_0$ is defined as an angle of a chief ray, and the shift amount is approximately calculated by:

the shift amount $= \Sigma_k a_k \times \sin \theta_0$.

Still preferably, in a solid-state image capturing device according to the present invention, a correcting coefficient for each layer above the light receiving elements that configures the light receiving region is defined as $a_k$ and the incident angle $\theta_0$ is defined as an incident angle within a changing deviation width of an incident chief ray in a case where an incident angle of a chief ray changes due to some conditions, and the shift amount is calculated by:

$\theta_k = \arcsin((\sin \theta_0) n_0 / n_k)$ $n_0 = 1$ provided that a medium is air the shift amount $= \Sigma_k a_k \times t_k \times \tan \theta_k$.

Still preferably, in a solid-state image capturing device according to the present invention, a correcting coefficient for each layer above the light receiving elements that configures the light receiving region is defined as $a_k$ and the incident angle $\theta_0$ is defined as an incident angle within a changing deviation width of an incident chief ray in a case where an incident angle of a chief ray changes due to some conditions, and the shift amount is approximately calculated by:

$$\text{the shift amount} = \Sigma_k a_k \times \sin \theta_0.$$

Still preferably, in a solid-state image capturing device according to the present invention, a case where an incident angle of the chief ray changes due to some conditions is a case where the incident angle of the chief ray changes due to a focus condition.

Still preferably, in a solid-state image capturing device according to the present invention, a case where an incident angle of the chief ray changes due to some conditions is a case where the incident angle of the chief ray changes due to a zoom condition.

Still preferably, in a solid-state image capturing device according to the present invention, different correcting coefficients are set as the correcting coefficient $a_k$ for a long edge direction and a short edge direction of the light receiving region and/or the light receiving elements.

Still preferably, in a solid-state image capturing device according to the present invention, different standard position is set as the correcting coefficient $a_k$ for a long edge direction and a short edge direction at the openings of the electrode wiring layers, the center of a pixel pitch, or the center of a photoelectric conversion device.

Still preferably, in a solid-state image capturing device according to the present invention, at least any of the openings of the electrode wiring layers, the color filters and the microlenses are shifted uniformly in relation to all the light receiving elements or in relation to a standard position where a light flux is desired to pass through over the light receiving elements so as to be arranged in the light receiving region, in all the light receiving elements or in response to the repetition of the layout for the electrode wiring layers or in response to the repetition for the color filters, in addition to the shifting of the microlenses, the color filters and the openings of the electrode wiring layers in relation to the light receiving elements or in relation to a standard position where a light flux is desired to pass through over the light receiving elements.

Still preferably, in a solid-state image capturing device according to the present invention, and in a case where wavelength dependence is observed in the refractive index $n_k$ of each layer above the light receiving elements that configures the light receiving region, the shift amount of the openings of the electrode wiring layers, the color filters and the microlenses in relation to the light receiving elements or in relation to a standard position where a light flux is desired to pass through over the light receiving elements are changed for every wavelength or every color of the color filters in accordance with the refractive index.

A solid-state image capturing apparatus according to the present invention is provided with the solid-state image capturing device according to the present invention and an image capturing optical system in front of the solid-state image capturing device, in which light enters from the image capturing optical system to the light receiving region.

Still preferably, in a solid-state image capturing apparatus according to the present invention, the image capturing optical system is a spherical lens, an aspherical lens or a Fresnel lens.

An electronic information device according to the present invention uses the solid-state image capturing device according to the present invention or the solid-state image capturing apparatus according to the present invention as an image input device in an image capturing section.

The functions of the present invention having the structures described above will be described hereinafter.

In order to solve the problems described above, the inventors of the present application have derived the shift amount of at least any of the openings of the electrode wiring layers, color filters and microlenses in relation to the light receiving elements or in relation to a standard position where a light flux is desired to pass through above the light receiving elements by using Snell's law (law of refraction) and a mathematical approximation theory as physical law so as to arrange the openings of the electrode wiring layers, color filters and microlenses in a pixel region.

With regard to a light flux entering at an output angle $\theta_0$ from an image capturing optical system, an angle $\theta_k$ at which the light flux advances in a material layer k that configures a solid-state image capturing device is calculated by:

$$\theta_k = \arcsin((\sin \theta_0) n_0/n_k).$$

Therefore, the shift amount of a microlens and so on can be calculated by using $\theta_k$ as follows:

$$\text{the shift amount} = \Sigma_k a_k \times t_k \times \tan \theta_k.$$

In the equation described above, $t_k$ is a film thickness of the material layer k, and $n_k$ is a refractive index of the material layer $M_k$. In addition, $a_k$ is a correction coefficient of the material layer k, where "1" is usually assumed but it may be other than "1", or the value, $a_k$="0" (extremely thin film; "0" means that a thin layer, such as a gate oxide layer, may be excluded) is possible. The correcting coefficient $a_k$ is used to correct, for example, a film thickness of microlenses, excluding a material layer, which is laminated at an even film thickness, because the thickness of the microlenses is not fixed. However, the correcting coefficient may also be used for other purposes (for example, if there is a dispersion from an expected value of a refractive index).

Further, when an angle $\theta$ is small, the approximate relationship of $\tan \theta \approx \sin \theta$ and $\sin \theta \approx \theta$ holds in general. If this assumption is introduced, a calculation equation of a shift amount for microlenses and the like can be simplified. As a result, the shift amount of microlenses and the like is calculated by:

$$\text{the shift amount} = \Sigma_k a_k \times \sin \theta_0.$$

It is also possible to vary the equation using another approximating expression other than the one above.

Further, an output angle of a chief ray entering from an image capturing optical system to each light receiving element, a specific angle between an upper ray and an lower ray of a light flux entering from an image capturing optical system to each light receiving element, and an intermediate angle between an upper ray and an lower ray of a light flux entering from an image capturing optical system to each light receiving element may be used as the incident angle $\theta_0$. Further, if an output angle of the chief ray from an image capturing optical system 101 changes due to a focus condition, an output angle within the deviation width of the chief ray entering from the image capturing optical system to each light receiving element may be used as the incident angle $\theta_0$.

Further, different correcting coefficients $a_k$ may be used for a long edge direction and a short edge direction of a light receiving region.

Further, with respect to the center of the light receiving region, there may be a case where the opening of the electrode wiring layer, which is made of metal and the like, and the center of the light receiving element do not match each other, or the center of the light receiving element (a region including a photodiode and a readout electrode) and the center of the photodiode, which configures the light receiving element, do not match each other. In such a case as this, microlenses and the like may be shifted in advance for each light receiving element in accordance with the amount of the incoordination.

Further, wavelength dependence is observed in a refractive index of almost all the material layers. Therefore, the shift amount of microlenses may be changed for each wavelength in accordance with the refractive index.

As described above, the present invention makes it possible to arrange at least any of microlenses, color filters and openings of electrode wiring layers in relation to various output angles of an image capturing optical system (incident angle from the image capturing optical system) in such a manner to continuously shift them in relation to respective light receiving elements in a light receiving region by a function based on Snell's law, thereby obtaining a good image without color shading or luminance shading due to the output angles of the image capturing optical system. Further, a shift amount for the microlens and the like is expressed as a function, so that the function is reusable in accordance with various kinds of image capturing optical systems, thereby shortening the design period and lowering design cost.

These and other advantages of the present invention will become apparent to those skilled in the art upon reading and understanding the following detailed description with reference to the accompanying figures.

10 solid-state image capturing device
    11 semiconductor substrate
    12, 12a, 12b, 12c, 12d light receiving element
    13, 13a, 13b, 13c electrode wiring layer
    14, 14a, 14b, 14c, 14d color filter
    15, 15a, 15b, 15c, 15d microlens
    90 electronic information device
    92 memory section
    93 display section
    94 communication section
    95 image output section
    100 image capturing region
    101, 101a, 101b module lens (image capturing optical system)

DESCRIPTION OF THE PREFERRED EMBODIMENTS

Hereinafter, an embodiment of a solid-state image capturing apparatus using a solid-state image capturing device according to the present invention will be described in detail with reference to the accompanying drawings, where the solid-state image capturing apparatus using the solid-state image capturing device according to the present invention is applied to a CMOS image sensor. In addition, the embodiment of the solid-state image capturing apparatus using the solid-state image capturing device according to the present invention may be applied not only to the a CMOS image sensor but also to a CCD image sensor.

Figure 1:
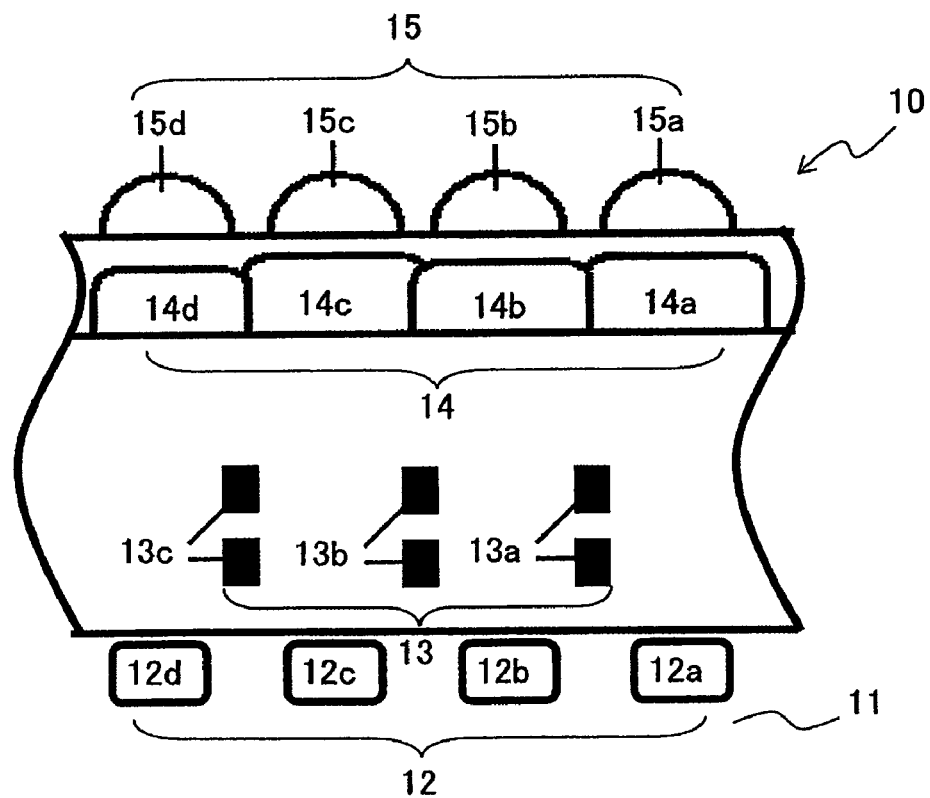
FIG. 1 is a longitudinal cross sectional view showing an exemplary essential structure of a solid-state image capturing device according to the embodiment of the present invention.

FIG. 1 is a longitudinal cross sectional view showing an exemplary essential structure of a solid-state image capturing device according to the embodiment of the present invention. Further, FIG. 1 also shows part of a light receiving region in the solid-state image capturing device according to the embodiment of the present invention.

In FIG. 1, a solid-state image capturing device 10 according to the embodiment includes a light receiving region, in which a plurality of light receiving elements 12 (12a, 12b, . . . ) are arranged in two dimensions (or in a matrix) on a semiconductor substrate 11. The light receiving elements 12 are configured with a photoelectric conversion element, such as a photodiode, and a charge readout electrode (so as to include a transistor) and the like.

On a light incident side of the plurality of light receiving elements 12, electrode wiring layers 13 (13a, 13b, . . . ) made of a metal and the like are provided in a multilayer structure to form openings of the electrode wiring layers in such a manner to avoid being directly above the light receiving elements 12. Above the electrode wiring layers 13, color filters 14 (14a, 14b, . . . ) are provided in such a manner to correspond to the respective light receiving elements 12. Further, above the color filters 14, microlenses 15 (15a, 15b, . . . ) are provided in such a manner so as to correspond to the respective light receiving elements 12 and color filters 14. The microlenses 15 are generally formed in such a manner that a pattern is formed in a lens material by photolithographic technique and subsequently the lens material is fluidized by a heat treatment to form a lens shape; however, the method for manufacturing the microlenses is not limited to the photolithographic technique as long as a characteristic of a lens is demonstrated. Further, it is popular nowadays to form multiple layers with respect to the metal layer; however, a single layer of the metal layer may also be formed. Further, although not shown in the figure, the solid-state image capturing apparatus is configured in such a manner that an image capturing optical system (a module lens, for example) is provided on the light incident side of the solid-state image capturing device 10 to allow light to enter the solid-state image capturing device 10.

Figure 10:
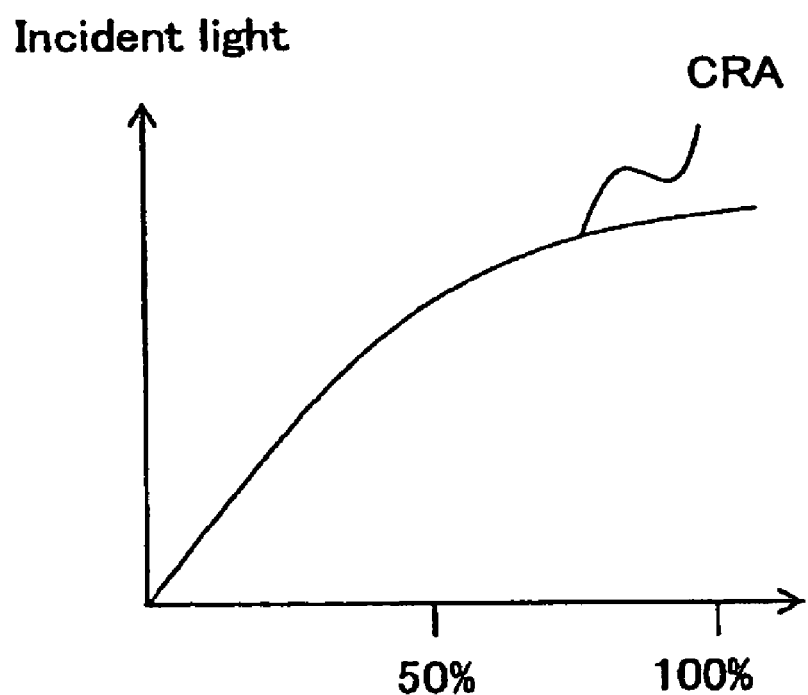
FIG. 10 is a graph schematically showing an incident angle of a chief ray in relation to an image height in an image capturing region of a solid-state image capturing device in FIG. 8.
Figure 11:
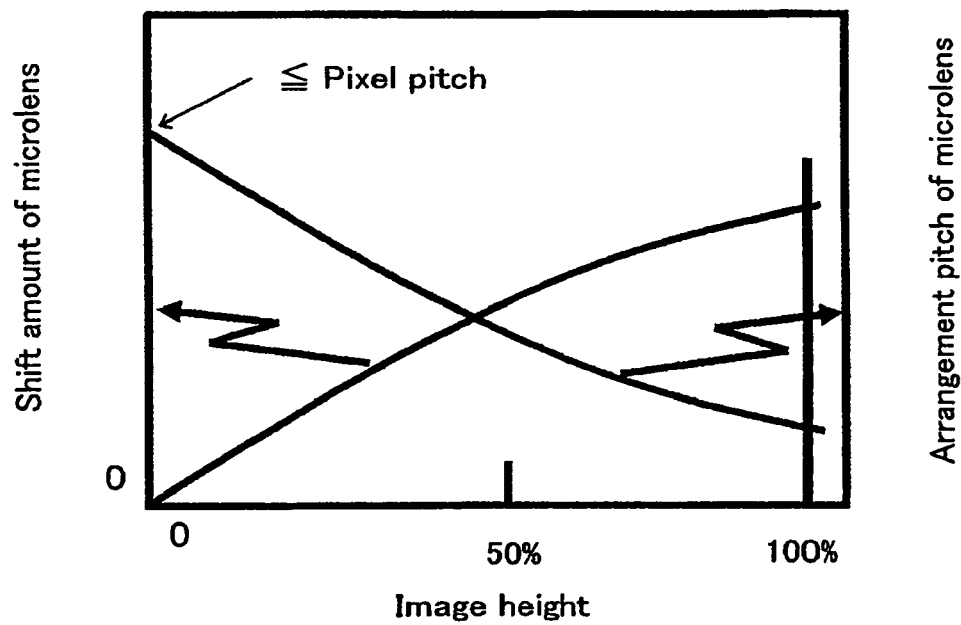
FIG. 11 is a graph showing a shift amount in relation to a light receiving element of a microlens as well as a relationship between an arrangement pitch of a microlens and an image height with respect to a conventional solid-state image capturing apparatus disclosed in Reference 1.
Figure 12:
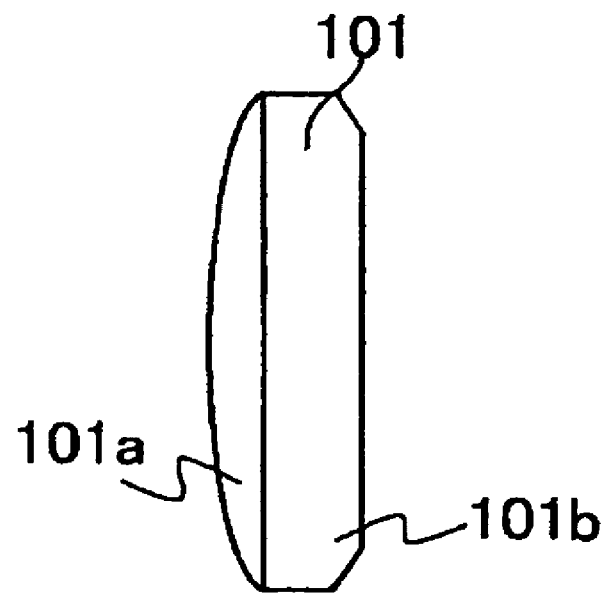
FIG. 12 is a longitudinal cross sectional view schematically showing an aspherical lens as an image capturing optical system.
Figure 13:
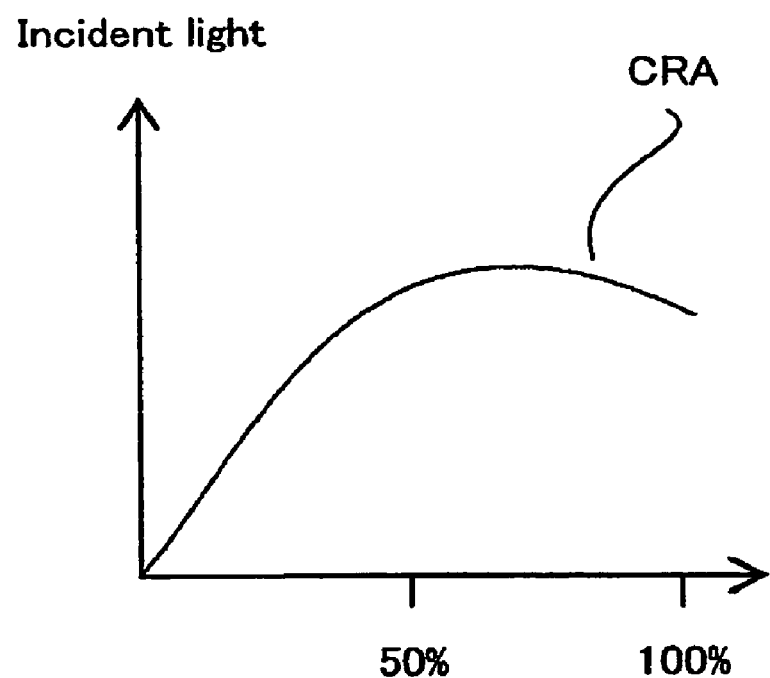
FIG. 13 is a graph schematically showing a lens characteristic where a chief ray angle once increases and decreases at a certain incident angle with respect to a conventional solid-state image capturing apparatus disclosed in Reference 2.
Figure 14:
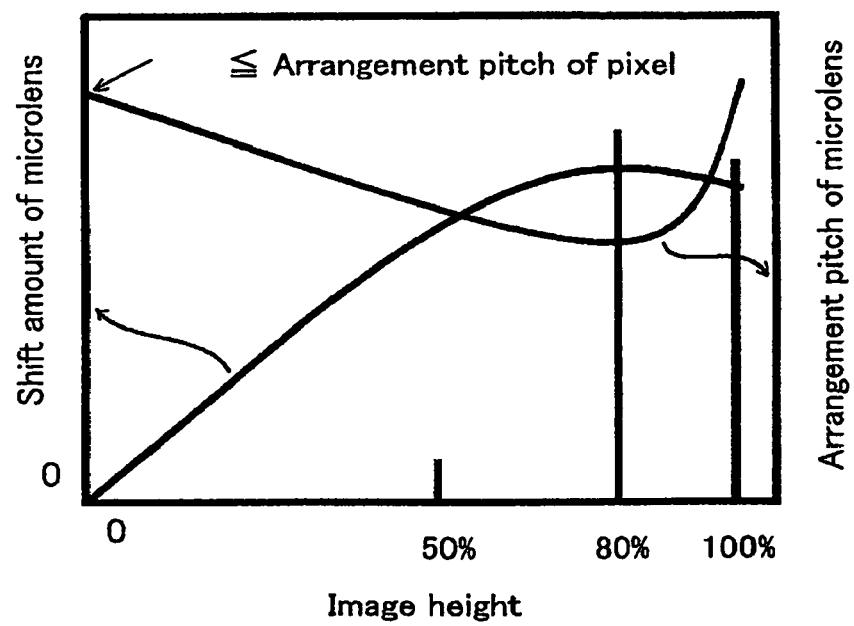
FIG. 14 is a graph showing a shift amount in relation to a light receiving element of a microlens as well as a relationship between an arrangement pitch of a microlens and an image height with respect to a conventional solid-state image capturing apparatus disclosed in Reference 2.

An incident angle $\theta_0$ (CRA shown in FIG. 10) of a chief ray C for an image height of an image capturing optical system (a module lens, for example) is given to calculate a shift amount (a shift amount in an optical axis direction or a direction approaching to an optical axis side) of at least any of the openings of the electrode wiring layers 13, color filters 14, and microlenses 15 in relation to the plurality of light receiving elements 12 by Snell's law based on an incident angle $\theta_0$ (a chief ray angle) of a light flux C (a chief ray) entering a light receiving region 100 to a surface of a solid-state image capturing device, a refractive index $n_k$ and a film thickness $t_k$ of each layer above the light receiving elements 12 that configure the light receiving region 100. As a result, at least any of the openings of the electrode wiring layers 13, color filters 14, and microlenses 15 are shifted in relation to the plurality of light receiving elements 12 to be arranged in the light receiving region 100.

Hereinafter, a method for deriving the shift amount of the microlenses 15, color filters 14, and the openings of the electrode wiring layers 13 in the solid-state image capturing device 10 according to the embodiment will be described in detail in relation to the light receiving elements 12.

Figure 2:
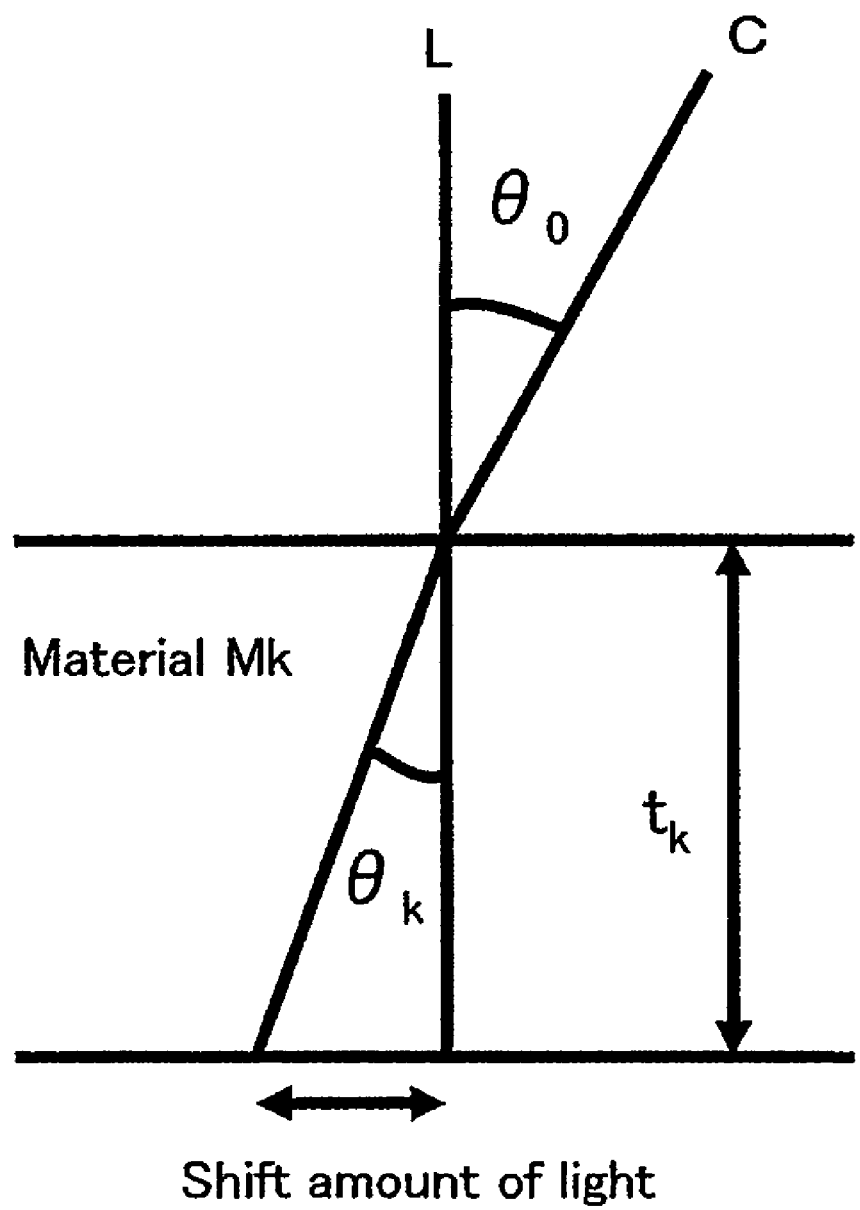
FIG. 2 is a diagram explaining an incident angle $\theta_0$ and a refractive angle $\theta_k$ and further explains a shift amount of light.

As shown in FIG. 2, a case is considered where a light flux C enters at an angle $\theta_0$ (an angle of emergence of the chief ray that enters from the image capturing optical system to the respective light receiving elements 12) formed together by a normal L of the light incident surface on a material layer Mk above the light receiving elements 12 that configure the solid-state image capturing device 10. If the refractive index of the material layer Mk is defined as $n_k$, an angle $\theta_k$ between the direction of travel of the light flux C and the normal L in the material layer Mk is calculated by Snell's law of refraction, $n_0 \sin \theta_0 = n_k \sin \theta_k$ $\sin \theta_k = (n_0/n_k) \sin \theta_0$ $\theta_k = \arcsin\{(\sin \theta_0) n_0/n_k\}$ where $n_0 = 1$ (air).

Subsequently, if the film thickness of the material layer Mk (the film thickness above the position where the light flux is adjusted) is defined as $t_k$, the shift amount of the light flux in the material layer Mk is calculated using $\theta_k$ in an equation: the shift amount of the light flux in the material layer $Mk = t_k \times \tan \theta_k$.

Figure 3:
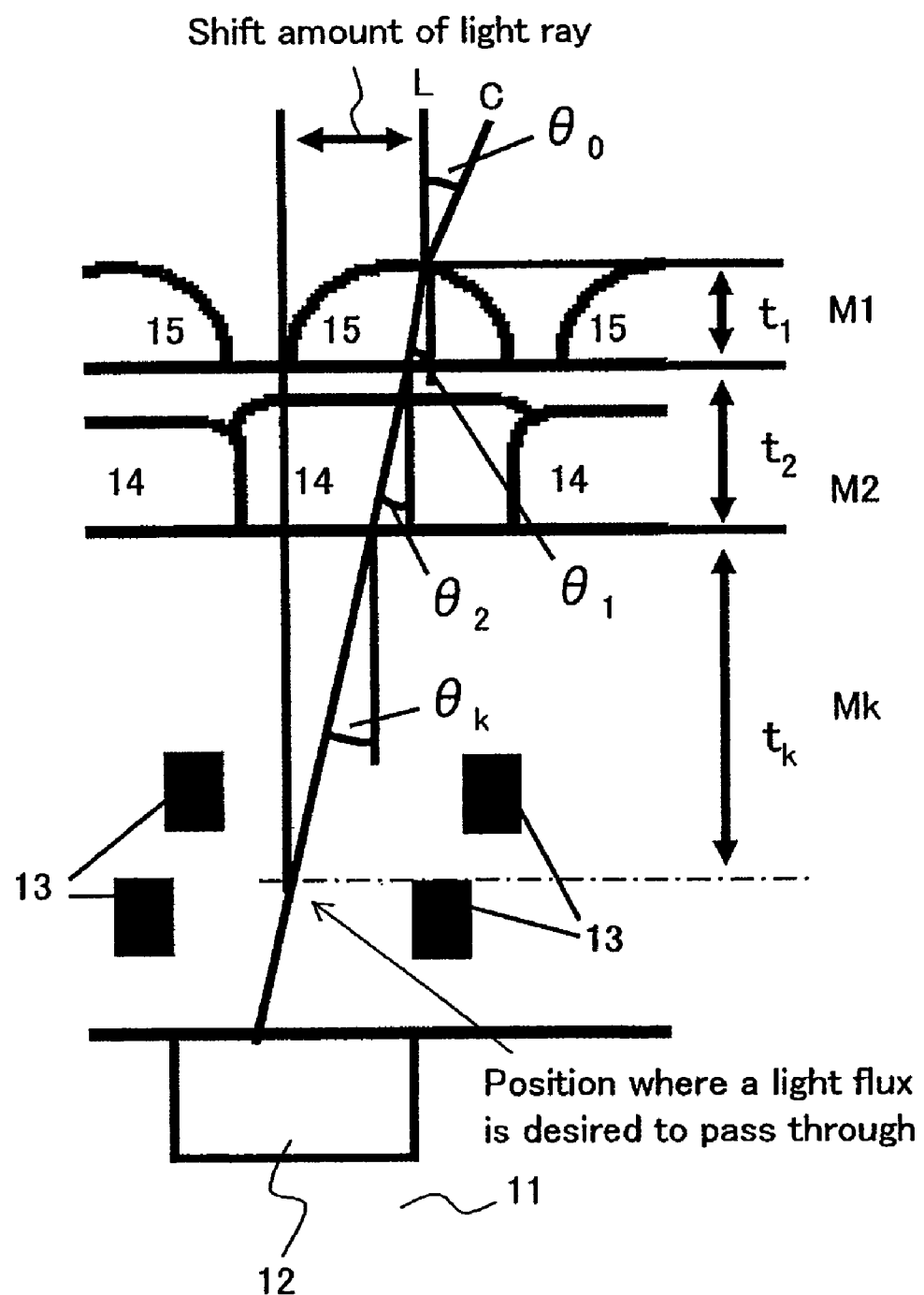
FIG. 3 is a diagram explaining a method for determining a shift amount of a light flux after the light flux, which has passed through microlenses and the like, passes through each layer.

Herein, in a case where the openings of the electrode wiring layers 13 are narrow (where it is difficult for the light flux to pass through), the shift amount is determined in such a manner that the amount of light that is adjusted to pass through the openings of the electrode wiring layers 13 becomes the most. Considering the cross section shown in FIG. 3, when light passes through the material layers from "M1" to "Mk" that configure each transmissive material from the microlenses 15 to the openings of the electrode wiring layers 13, a total shift amount of the light flux is calculated by:

the shift amount of the light flux C from the material layer M1 to the material layer $Mk = \Sigma_k t_k \times \tan \theta_k$. However, since there is a layer, such as a microlens 15, whose film thickness $t_1$ is indistinct (the film thickness cannot be determined since the microlens is in a lens shape), the above equation is multiplied by a correcting coefficient $a_k$, the shift amount of the light flux C from the material layer M1 to the material layer $Mk = \Sigma_k \times a_k \times t_k \times \tan \theta_k$.

In addition, the correcting coefficient $a_k$ is defined as "1" in most cases.

Besides, the refractive index $n_k$ is a value that depends on a material, and therefore it is adjustable with a correcting coefficient $a_k$ (0-2.0). For example, although a refractive index n=2 is used for $Si_3N_4$ in general, it may vary depending on its manufacturing condition, wavelength and the like. Further, an acrylic resin (PMMA), as used for an optical fiber and the like, also has a wide variety of refractive indices, it is adjusted with a correcting coefficient $a_k$ in accordance with a material characteristic.

Figure 4:
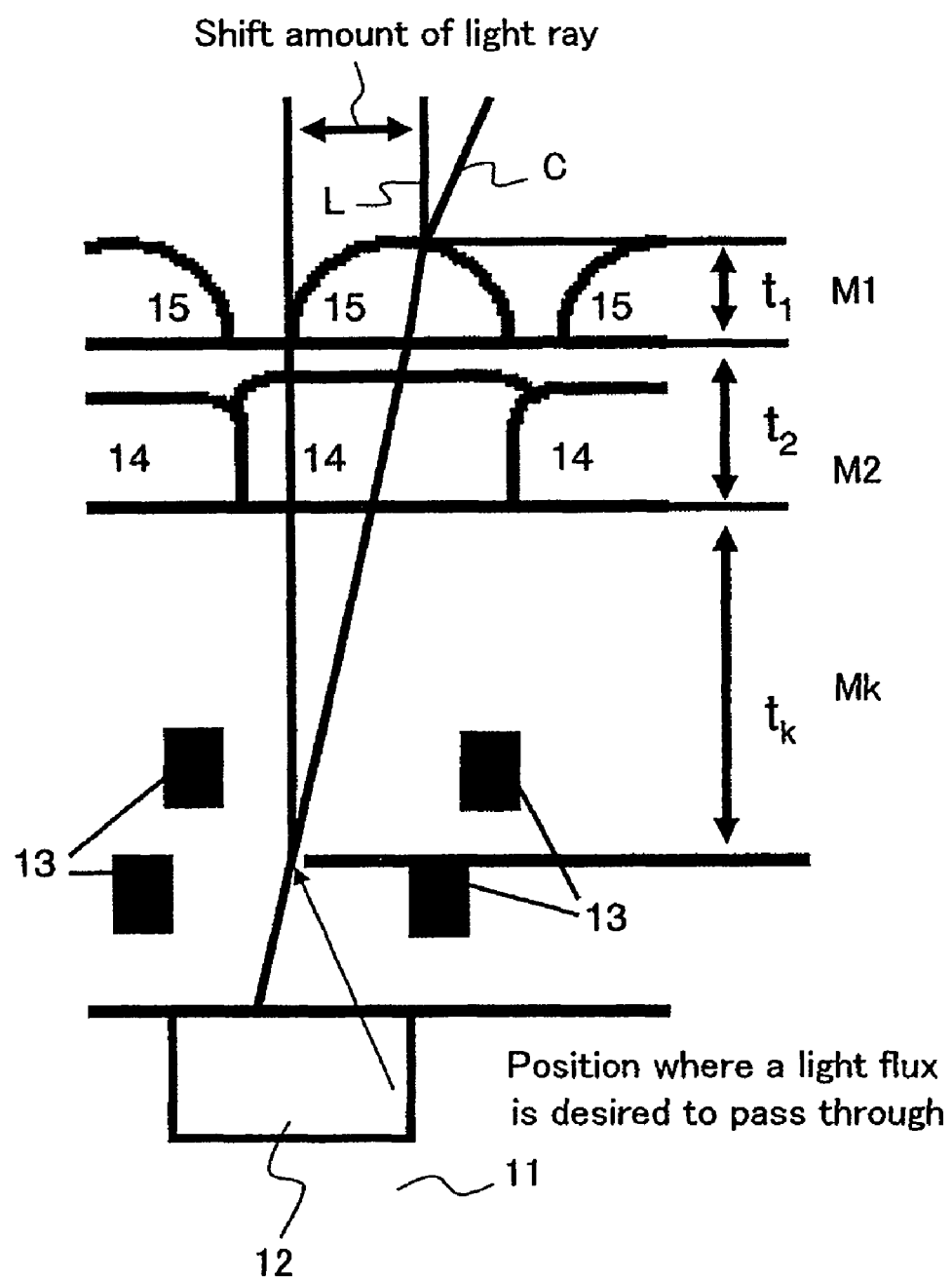
FIG. 4 is a diagram explaining a shift amount of a microlens in relation to an opening of an electrode wiring layer.

The shift of the microlens 15 described above in relation to the light receiving elements 12 is conducted to correct the shift amount of the light flux C. Therefore, the shift amount of the light flux C described above may be defined as the shift amount of the microlens 15 if the position of the microlens 15 is shifted so that light passes through, for example, the position where the light flux C is desired to pass through in FIG. 4. Therefore, the shift amount of the microlens $15 = \Sigma_k a_k \times t_k \times \tan \theta_k$.

Similarly, an interlayer film that takes the summation of the above (the total sum) can be changed to calculate a shift amount for the color filter 14, the opening of the electrode wiring layer 13 and the like.

Figure 5:
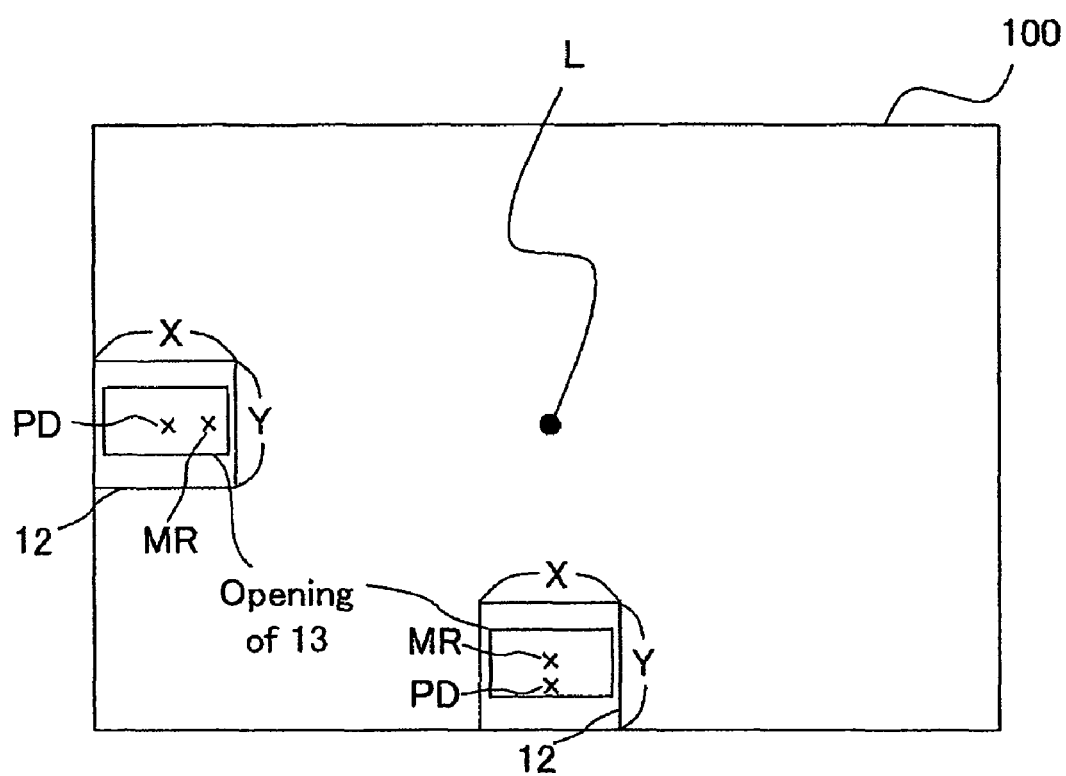
FIG. 5 is a diagram explaining a case where a light receiving element provided in a light receiving region is a rectangle and correcting coefficients are different for a long edge direction and a short edge direction of the light receiving element.

Further, it is assumed that standard positions where the light flux C is desired to pass through (the light flux shifts due to the depth differences between the center MR of the openings of the electrode wiring layer 13 and the center PD of the openings of the light receiving elements 12 (light receiving section)) are different in the short edge direction y and the long edge direction x of the light receiving region 100 (the openings of the electrode wiring layers 13 are also rectangles) as shown in FIG. 5. The position where the light flux C is desired to pass through is adjusted to the center PD of light receiving element 12 (light receiving section) if the openings of the electrode wiring layers 13 are rectangle and have enough margin as in the long edge direction x, while the position where the light flux C is desired to pass through as a standard position is adjusted to the center MR of the opening of the electrode wiring layer 13 if the opening of the electrode wiring layers 13 is small and light hits the circumference as in the short edge direction y, causing the standard position shifted off the center PD. Such a case as this may be dealt with by using different values as a correcting coefficient $a_k$ for the short edge direction and the long edge direction. In addition, such a case may also be dealt with by setting different standard positions for the short edge direction and the long edge direction.

From the above description, a continuous placement of the microlenses 15, color filters 14 and the openings of the electrode wiring layers 13 and the like becomes feasible for various output angles of the image capturing optical system by a function based on the Snell's law according to the embodiment of the present invention, thereby realizing the solid-state image capturing device 10 which obtains a good image without color shading or luminance shading due to the output angles of the image capturing optical system. Further, the shift amount for the microlens 15 and the like may be expressed as a function, so that the function is reusable in accordance with various kinds of image capturing optical systems, thereby shortening design period and lowering design cost.

In the embodiment described above, although the correcting coefficient for each layer above the light receiving elements 12 that configure the light receiving region is determined as $a_k$ and the shift amount of the microlenses 15, the color filters 14 and the openings of the electrode wiring layers 13 and the like are calculated by:

$$\text{the shift amount} = \Sigma_k a_k \times t_k \times \tan \theta_k,$$

the equation is not limited to this, but $$\text{the shift amount} = a_k \times \sin \theta_k$$

may also be used to calculate the shift amount approximately (an approximation by a mathematical process). When $\tan \theta_k$ is approximated to $\sin \theta_k$ here, the following can be obtained by the Snell's law:

$$n_0 \sin \theta_0 = n_k \sin \theta_k$$

$$\sin \theta_k = (n_0/n_k) \sin \theta_0$$

$$\Sigma_k t_k \times \sin \theta_k = \Sigma_k t_k \times (n_0/n_k) \times \sin \theta_0$$

thus, $t_k \times (n_0/n_k) = a_{kall}$, and $$\text{the shift amount} = a_{kall} \times \sin \theta_0$$

Therefore, $a_k$ is limited in magnitude, $a_{kall}$ is not.

In addition, a correcting coefficient for a thick film layer above the light receiving elements 12 that configure the light receiving region 100 is determined as $a_{k1}$ and the shift amount through the thick film layer is calculated by:

$$\theta_k = \arcsin((\sin \theta_0) n_0/n_k)$$

$n_0 = 1$ provided that the medium is air $$\text{the shift amount} = \Sigma_k a_{k1} \times t_k \times \tan \theta_k$$

and a correcting coefficient for a thin film layer above the light receiving elements 12 that configure the light receiving region 100 is defined as $a_{k2}$. As the shift amount through the thin film layer is calculated approximately by:

$$\text{the shift amount} = a_{k2all} \times \sin \theta_0,$$

the shift amount is calculated for the thick film layer without the approximate expression while the shift amount through the thin film layer may be calculated using the approximate expression. Herein, $a_{k2all}$ is not limited in magnitude unlike the previous $a_k$.

Figure 6:
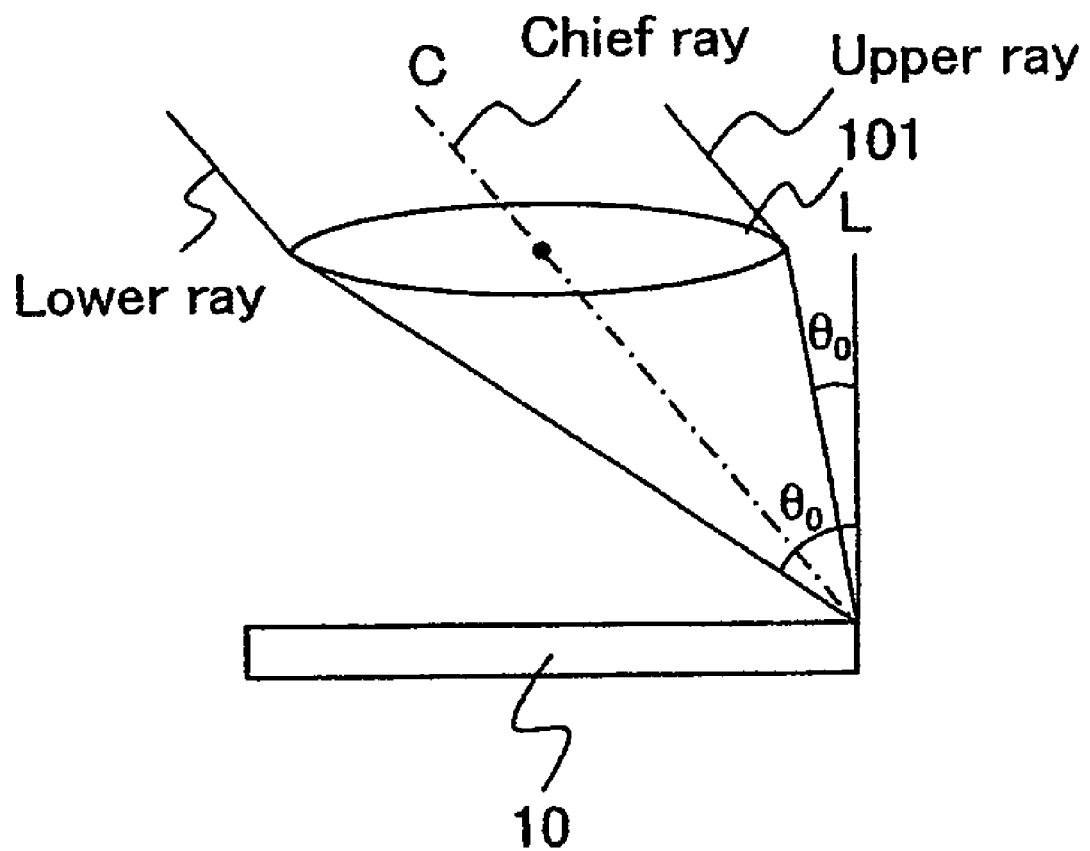
FIG. 6 is a diagram explaining an upper ray, a chief ray, and a lower ray of an incident light.
Figure 7:
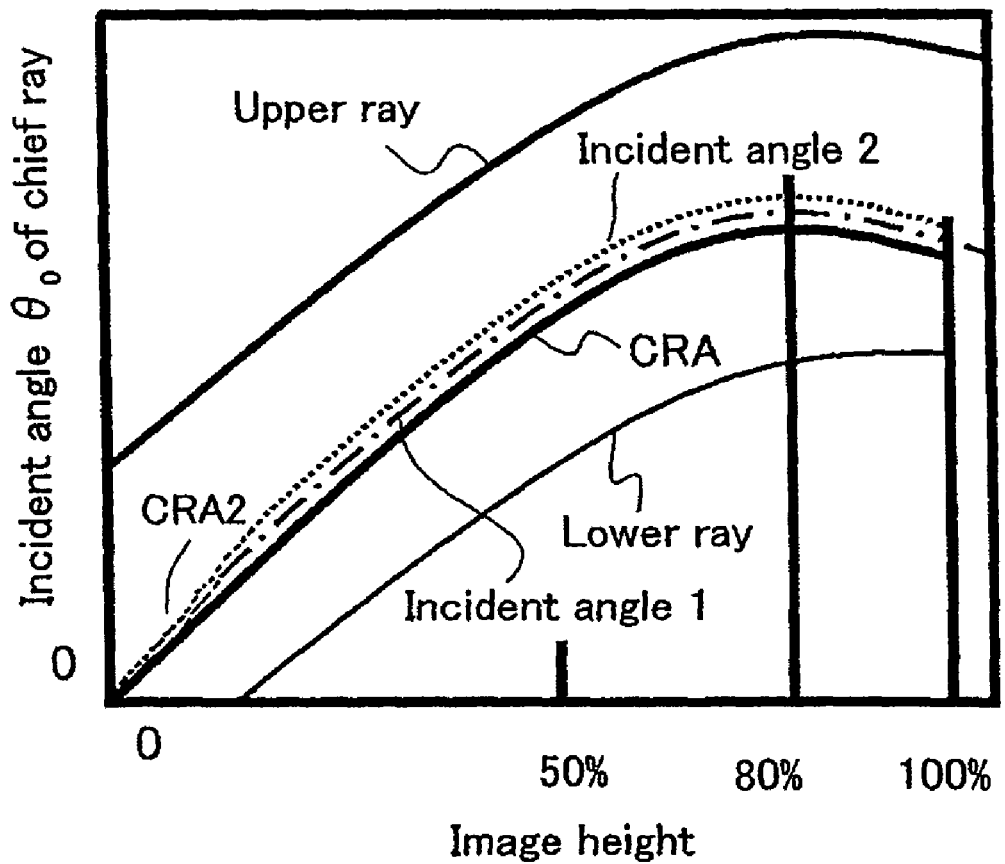
FIG. 7 is a graph schematically showing an incident light angle in view of an upper ray and a lower ray in addition to a chief ray angle in relation to an image height in an image capturing region of a solid-state image capturing device according to the present invention.
Figure 8:
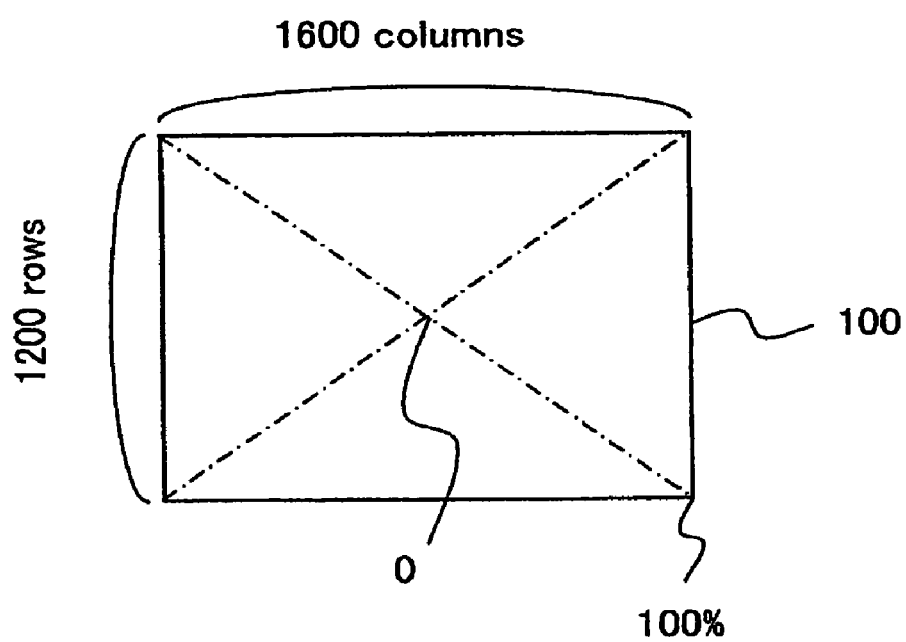
FIG. 8 is a plane view schematically showing an image capturing region of a conventional solid-state image capturing device.
Figure 9:
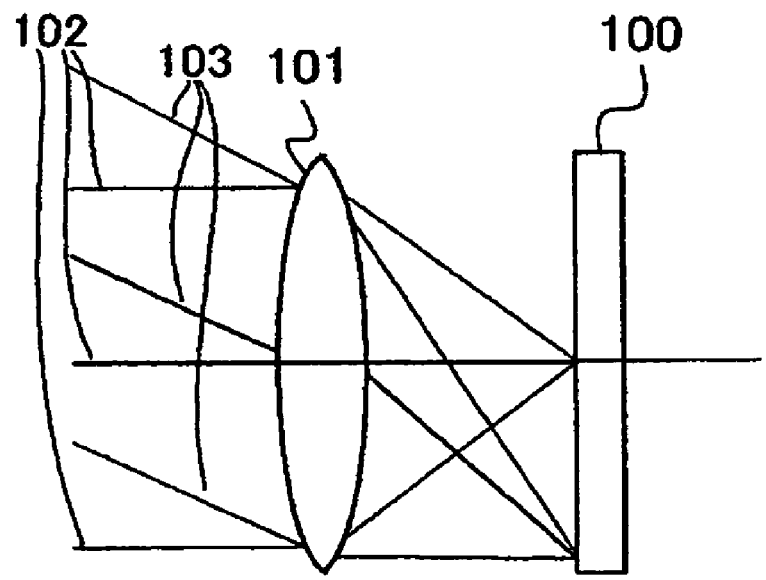
FIG. 9 is a longitudinal cross sectional view of an essential structure showing a state where a chief ray with an incident angle is entering into an image capturing region of the solid-state image capturing device in FIG. 8.

In the embodiment described above, the output angle of the chief ray (light flux C) entering from the image capturing optical system towards each light receiving element 12 of the solid-state image capturing device 10 is used as an incident angle $\theta_0$, but the incident angle is not limited to this. As shown in FIG. 6, the light passing through the center is defined as a chief ray; however, a specific angle may be used between the upper ray (ray with smaller $\theta_0$) and the lower ray (ray with larger $\theta_0$) of a light flux C entering from an image capturing optical system 101 to each light receiving element 12 of the solid-state image capturing device 10, such as an intermediate angle (or an average angle). In this case with regard to the image capturing optical system 101, the CRA of the chief ray does not exist in the middle of the upper ray and the lower ray as shown in FIG. 7, and it is shifting unparallel upwardly like the incident angle 1, for example, shown by a dashed line.

That is, the correcting coefficient for each layer that configures the light receiving region 100 of the solid-state image capturing device 10 is defined as $a_k$ and the incident angle $\theta_0$ is defined as a specific angle between the upper ray (ray with smaller $\theta_0$) and the lower ray (ray with larger $\theta_0$) of a light flux C entering from the image capturing optical system 101 to each light receiving element 12, such as an intermediate angle (or an average angle). The shift amount of any of the openings of the electrode wiring layers 13, the color filters 14, and the microlenses 15 in relation to the light receiving elements 12 or the standard position above the light receiving element 12 where the light flux C is desired to pass through (the opening of the electrode wiring layer 13, for example) may be calculated by:

$$\theta_k = \arcsin((\sin \theta_0) n_0/n_k)$$

the shift amount of the microlens 15 and the like $= \Sigma_k a_k \times t_k \times \tan \theta_k$.

Similarly, the correcting coefficient for each layer that configures the light receiving region 100 of the solid-state image capturing device 10 is defined as $a_k$ and the incident angle $\theta_0$ is defined as a specific angle between the upper ray and the lower ray of a light flux C entering from the image capturing optical system 101 to each light receiving element 12, such as an intermediate angle. The shift amount of any of the openings of the electrode wiring layers 13, color filters 14, and microlenses 15 in relation to the light receiving elements 12 and the like may also be calculated approximately by:

$$\text{the shift amount} = a_k = \sin \theta_0.$$

Even in a case where the width of the incident ray is wide, the shift amount may be adjusted so as to focus the most amount of light in each light receiving element 12.

In addition, the correcting coefficient for each layer above the light receiving elements 12 that configures the light receiving region 100 is defined as $a_k$ and the incident angle $\theta_0$ of the incident light is defined as a an intermediate angle between the intermediate angle from the upper ray to the lower ray and the chief ray of the incident light. The shift amount may be calculated by:

$$\theta_k = \arcsin((\sin \theta_0) n_0/n_k)$$

$$\text{the shift amount} = \Sigma_k a_k \times t_k \times \tan \theta_k.$$

In this case, the incident angle 2 shown by the dashed line in FIG. 7 between the incident angle 1 shown by the dashed line in FIG. 7 and the chief ray is shifted towards the upper side of the chief ray.

The correcting coefficient for each layer above the light receiving elements 12 that configures the light receiving region 100 is defined as $a_k$ and the incident angle $\theta_0$ of the incident light is defined as an intermediate angle between the intermediate angle from the upper ray to the lower ray and the chief ray of the incident light. The shift amount may be calculated approximately by:

$$\text{the shift amount} = a_k \times \sin \theta_0.$$

In this case, the incident angle 2 shown by the dashed line in FIG. 7 between the incident angle 1 shown by the dashed line in FIG. 7 and the chief ray is shifted towards the upper side of the chief ray.

According to the description above, the standard position where the light flux is desired to pass through is at any one of the upper most layer, intermediate layer, lower most layer, the center of the pixels on the substrate and the center of the photoelectric conversion device.

Next, if a incident angle $\theta_0$ of the chief ray (light flux C) from an image capturing optical system 101 changes due to a focus condition, a zoom condition and the like, an output angle within the deviation width of the chief ray (light flux C) entering from the image capturing optical system 101 towards each light receiving element 12 may be used as the incident angle $\theta_0$. For example, the incident angle $\theta_0$ also changes if a module lens moves depending on images which the image capturing optical system 101 is to take by auto focusing. The range of changing incident angle $\theta_0$, namely the incident angle within the deviation width of the chief ray (light flux C) is used. The same applies to devices with different zoom conditions. In short, although it is suitable to set the incident angle $\theta_0$ to the one that is used most, $\theta_0$ may be set in the middle of the deviation width if the permissible amount is small for the deviation width of the incident angle to the light receiving element.

That is, the correcting coefficient for each layer that configures the light receiving region 100 of the solid-state image capturing device 10 is defined as $a_k$ and the incident angle $\theta_0$ is defined as an incident angle within the deviation width of the chief ray from the image capturing optical system 101 to each light receiving element 12 in a case where the incident angle of the chief ray from the image capturing optical system 101 changes due to some conditions (for example, when a lens moves for a zoom shot). The shift amount of any of the openings of the electrode wiring layers 13, the color filters 14, and the microlenses 15 in relation to the light receiving elements 12 or the standard position above the light receiving element 12 where the light flux C is desired to pass through (the opening of the electrode wiring layer 13, for example) is calculated by:

$\theta_k = \arcsin((\sin \theta_0) n_0 / n_k)$ the shift amount of the microlenses and the like $= \Sigma_k a_k \times t_k \times \tan \theta_k$.

Similarly, the correcting coefficient for each layer that configures the light receiving region 100 of the solid-state image capturing device 10 is defined as $a_k$ and the incident angle $\theta_0$ is defined as an incident angle within the deviation width of the chief ray from the image capturing optical system 101 to each light receiving element 12 in a case where the incident angle of the chief ray from the image capturing optical system 101 changes due to some conditions. The shift amount of any of the openings of the electrode wiring layers 13, the color filters 14, and the microlenses 15 in relation to the light receiving elements 12 or the standard position above the light receiving element 12 where the light flux C is desired to pass through (the opening of the electrode wiring layer 13, for example) is calculated approximately by:

the shift amount $= \Sigma_k a_k \times \sin \theta_0$.

Further, although not specifically described in the embodiment described above, if the opening of the electrode wiring layer 13 and the center of the light receiving element pitch (2.2 μm pitch if one light receiving element is configured to be 2.2 μm×2.2 μm (height and width)) do not match each other in a light receiving region 100, or if the center of the light receiving element 12 and the center of the photodiode do not match each other (FIG. 5), the microlenses 15, the color filters 14 and the openings of the electrode wiring layers 13 are shifted uniformly in relation to all the light receiving elements 12, or in response to the repetition of the layout for the electrode wiring layers, or in response to the repetition of the layout for the color filters 14, in addition to the shifting of the microlenses 15, the color filters 14 and the openings of the electrode wiring layers 13 in relation to the light receiving elements 12, thereby focusing in the light receiving elements 12 the most.

Further, different correcting coefficients are set as a correcting coefficient $a_k$ both in the long edge direction and the short edge direction of the light receiving region 100. In addition to or apart from this, different correcting coefficients may be set as a correcting coefficient $a_k$ both in the long edge direction and the short edge direction of the light receiving element 12. Further, in addition to or apart from this, different correcting coefficients may be set as a correcting coefficient $a_k$ both in the long edge direction and the short edge direction of the opening of the electrode wiring layer 13.

Further, if wavelength dependence is observed in the refractive index $n_k$ of the material layer Mk that configures the solid-state image capturing device 10, the shift amount of the microlenses 15, color filters 14 and the openings of the electrode wiring layers 13 are changed for every wavelength or every color of the color filters 14 in accordance with the refractive index.

Further, although microlenses 15, color filters 14 and the openings of the electrode wiring layers 13 are shifted in relation to the light receiving elements 12 in the embodiment described above, only one or two of them may be shifted.

Although not specifically described in the embodiment described above, the present invention can be applied to an electronic information device having, for example, a digital camera (e.g., digital video camera, digital still camera), an image input camera (e.g., monitoring camera, door intercom camera, car-mounted camera, camera for television telephone and camera for cell phone), and an image input device (e.g., scanner, facsimile and cell phone device equipped with camera) using a solid-state image capturing device 10 described above.

Figure 15:
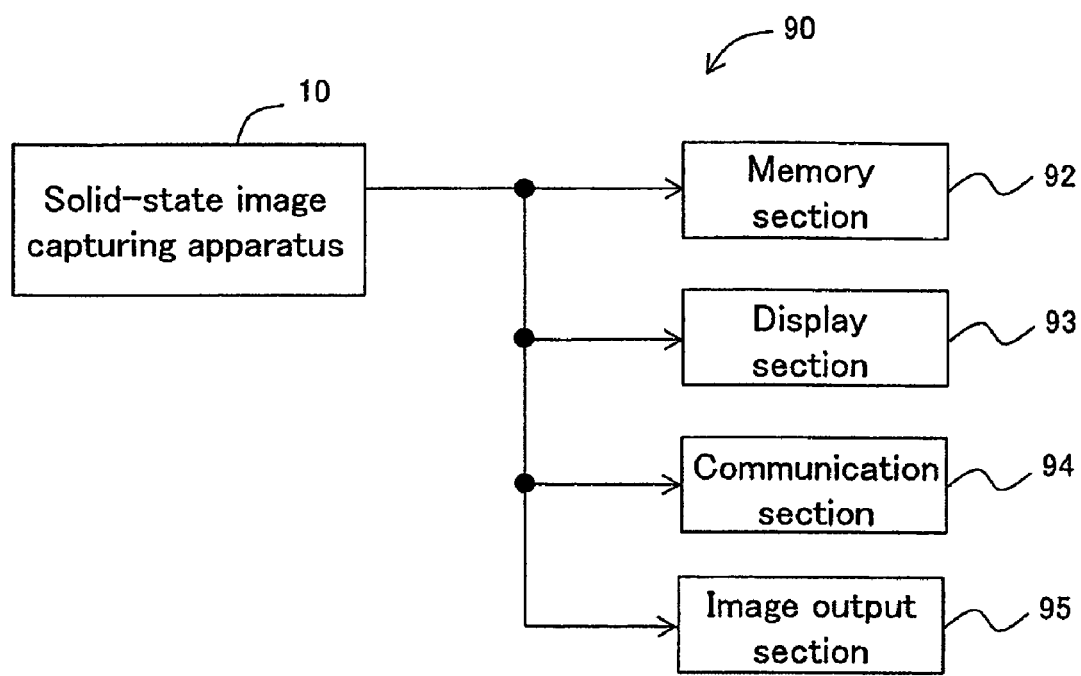
FIG. 15 is a block diagram showing an exemplary schematic structure of an electronic information device using the solid-state image capturing device according to Embodiment of the present invention for an image capturing section thereof.

FIG. 15 is a block diagram showing an exemplary schematic structure of an electronic information device using the solid-state image capturing device 10 according to Embodiment of the present invention for an image capturing section thereof.

In FIG. 15, the electronic information device 90 according to the present invention includes at least one of the following: a memory section 92 (e.g., recording media) for data-recording high quality image data obtained by using the solid-state image capturing device 10 as an image capturing section after a predetermined signal process for recording is performed; a display section 93 (e.g., liquid crystal display device) for displaying the image data on a display screen (e.g., liquid crystal display screen) after a predetermined signal process is performed; a communication section 94 (e.g., transmitting and receiving device) for communicating image data after a predetermined signal process is performed on the image data for communication; and an image output section 95 for printing (typing out) and outputting (printing out) the image data.

As described above, the present invention is exemplified by the use of its preferred embodiment. However, the present invention should not be interpreted solely based on the embodiment described above. It is understood that the scope of the present invention should be interpreted solely based on the claims. It is also understood that those skilled in the art can implement equivalent scope of technology, based on the description of the present invention and common knowledge from the description of the detailed preferred embodiment of the present invention. Furthermore, it is understood that any patent, any patent application and any references cited in the present specification should be incorporated by reference in the present specification in the same manner as the contents are specifically described therein.

INDUSTRIAL APPLICABILITY

In the field of a solid-state image capturing device, such as a CCD image sensor and a CMOS image sensor, provided with at least any of openings of electrode wiring layers, color filters and microlenses above a plurality of light receiving elements as an image capturing region, for taking an image light from a subject by the plurality of light receiving elements; a solid-state image capturing apparatus provided with the solid-state image capturing device and an image capturing optical system in front of the solid-state image capturing device; and an electronic information device having, for example, a digital camera (e.g., digital video camera, digital still camera), an image input camera, a scanner, a facsimile and a cell phone device equipped with a camera, using the solid-state image capturing device or the solid-state image capturing apparatus as an image input device in the image capturing section, the present invention makes it possible to arrange at least any of microlenses, color filters and openings of electrode wiring layers in relation to various output angles of an image capturing optical system (incident angle from the image capturing optical system) in such a manner to continuously shift them in relation to respective light receiving elements in a light receiving region by a function based on Snell's law, thereby obtaining a good image without color shading or luminance shading due to the output angles of the image capturing optical system. Further, a shift amount for the microlens and the like is expressed as a function, so that the function is reusable in accordance with various kinds of image capturing optical systems, thereby shortening a design period and lowering a design cost.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image capturing device in which at least any of openings of electrode wiring layers, color filters and microlenses provided on a light incident side above light receiving elements as a light receiving region in which the plurality of light receiving elements are disposed on a semiconductor substrate or a semiconductor region provided on a substrate, wherein a first shift amount is calculated by Snell's law based on an incident angle $\theta_0$ of a light flux entering the light receiving region to a surface of the solid-state image capturing device, a refractive index $n_k$ and a film thickness $t_k$ of each layer above the light receiving elements that configures the light receiving region, so that either one or two of the openings of the electrode wiring layers, the color filters, and the microlenses are shifted by a first shift amount in relation to the plurality of light receiving elements or in relation to a predetermined position where the light flux is desired to pass through so as to be arranged in the light receiving region, and wherein the remaining either one or two of the openings of the electrode wiring layers, the color filters, and the microlenses, not shifted by the first shift amount, are shifted by a second shift amount which is different from the first shift amount.

2. The image capturing device according to claim 1, wherein the predetermined position where the light flux is desired to pass through is at any one of an upper most layer, an intermediate layer and a lower most layer of the openings of the electrode wiring layers as well as a center of pixels on the substrate and a center of a photoelectric conversion device.

3. A solid-state image capturing device according to claim 1, wherein a correcting coefficient for each layer above the light receiving elements that configures the light receiving region is determined as $a_k$ and the shift amount is calculated by:

$\theta_0 = \arcsin((\sin\theta_0)n_0/n_k)$ $n_0 = 1$ provided that the medium is air, the shift amount $= \Sigma_k a_k \times t_k \times \tan\theta_k$.

4. A solid-state image capturing device according to claim 1, wherein a correcting coefficient for each layer above the light receiving elements that configures the light receiving region is determined as $a_k$ and the shift amount is approximately calculated by:

the shift amount $= \Sigma_k a_k \times \sin\theta_0$.

5. A solid-state image capturing device according to claim 1, wherein a correcting coefficient for a thick film layer above the light receiving elements that configures the light receiving region is determined as $a_{k1}$ and the shift amount through the thick layer is calculated by:

$\theta_0 = \arcsin((\sin\theta_0)n_0/n_k)$ $n_0 = 1$ provided that the medium is air, the shift amount $= \Sigma_k a_k \times t_k \times \tan\theta_k$, and wherein a correcting coefficient for a thin film layer above the light receiving elements that configure the light receiving region is determined as $a_{k2}$ and the shift amount through the thin film layer is approximately calculated by:

the shift amount $= \Sigma_k a_k \times \sin\theta_0$.

6. A solid-state image capturing device according to claim 1, wherein a correcting coefficient for each layer above the light receiving elements that configures the light receiving region is defined as $a_k$ and the incident angle $\theta_0$ is defined as a specific angle between an upper ray and a lower ray of incident light, and the shift amount is calculated by:

$\theta_0 = \arcsin((\sin\theta_0)n_0/n_k)$ $n_0 = 1$ provided that the medium is air, the shift amount $= \Sigma_k a_k \times t_k \times \tan\theta_k$.

7. A solid-state image capturing device according to claim 1, wherein a correcting coefficient for each layer above the light receiving elements that configures the light receiving region is defined as $a_k$ and the incident angle $\theta_0$ is defined as a specific angle between an upper ray and a lower ray of an incident light, and the shift amount is approximately calculated by:

the shift amount $= \Sigma_k a_k \times \sin\theta_0$.

8. A solid-state image capturing device according to claim 1, wherein a correcting coefficient for each layer above the light receiving elements that configures the light receiving region is defined as $a_k$ and the incident angle $\theta_0$ is defined as an intermediate angle between an upper ray and a lower ray of an incident light, the shift is calculated by:

$\theta_0 = \arcsin((\sin \theta_0) n_0 / n_k)$ $n_0 = 1$ provided that the medium is air, the shift amount $= \Sigma_k a_k \times t_k \times \tan \theta_k$.

9. A solid-state image capturing device according to claim 1, wherein a correcting coefficient for each layer above the light receiving elements that configures the light receiving region is defined as $a_k$ and the incident angle $\theta_0$ is defined as an intermediate angle between an upper ray and a lower ray of an incident light, the shift amount is approximately calculated by:

the shift amount $= \Sigma_k a_k \times \sin \theta_0$.

10. A solid-state image capturing device according to claim 1, wherein a correcting coefficient for each layer above the light receiving elements that configures the light receiving region is defined as $a_k$ and the incident angle $\theta_0$ is defined as an intermediate angle between an intermediate angle from an upper ray to a lower ray and a chief ray of the incident light, and the shift amount is calculated by:

$\theta_0 = \arcsin((\sin \theta_0) n_0 / n_k)$ $n_0 = 1$ provided that the medium is air, the shift amount $= \Sigma_k a_k \times t_k \times \tan \theta_k$.

11. A solid-state image capturing device according to claim 1, wherein a correcting coefficient for each layer above the light receiving elements that configures the light receiving region is defined as $a_k$ and the incident angle $\theta_0$ is defined as an intermediate angle between an intermediate angle from an upper ray to a lower ray and a chief ray of the incident light, the shift amount is approximately calculated by:

the shift amount $= \Sigma_k a_k \times \sin \theta_0$.

12. A solid-state image capturing device according to claim 1, wherein a correcting coefficient for each layer above the light receiving elements that configures the light receiving region is defined as $a_k$ and the incident angle $\theta_0$ is defined as an angle of a chief ray, and the shift amount is calculated by:

$\theta_0 = \arcsin((\sin \theta_0) n_0 / n_k)$ $n_0 = 1$ provided that the medium is air, the shift amount $= \Sigma_k a_k \times t_k \times \tan \theta_k$.

13. A solid-state image capturing device according to claim 1, wherein a correcting coefficient for each layer above the light receiving elements that configures the light receiving region is defined as $a_k$ and the incident angle $\theta_0$ is defined as an angle of a chief ray, and the shift amount is approximately calculated by:

the shift amount $= \Sigma_k a_k \times \sin \theta_0$.

14. A solid-state image capturing device according to claim 1, wherein a correcting coefficient for each layer above the light receiving elements that configures the light receiving region is defined as $a_k$ and the incident angle $\theta_0$ is defined as an incident angle within a changing deviation width of an incident chief ray in a case where an incident angle of a chief ray changes due to some conditions, and the shift amount is calculated by:

$\theta_0 = \arcsin((\sin \theta_0) n_0 / n_k)$ $n_0 = 1$ provided that the medium is air, the shift amount $= \Sigma_k a_k \times t_k \times \tan \theta_k$.

15. A solid-state image capturing device according to claim 1, wherein a correcting coefficient for each layer above the light receiving elements that configures the light receiving region is defined as $a_k$ and the incident angle $\theta_0$ is defined as an incident angle within a changing deviation width of an incident chief ray in a case where an incident angle of a chief ray changes due to some conditions, and the shift amount is approximately calculated by:

the shift amount $= \Sigma_k a_k \times \sin \theta_0$.

16. A solid-state image capturing device according to claim 14, wherein a case where an incident angle of the chief ray changes due to some conditions is a case where the incident angle of the chief ray changes due to a focus condition.

17. A solid-state image capturing device according to claim 15, wherein a case where an incident angle of the chief ray changes due to some conditions is a case where the incident angle of the chief ray changes due to a focus condition.

18. A solid-state image capturing device according to claim 14, where in a case where an incident angle of the chief ray changes due to some conditions is a case where the incident angle of the chief ray changes due to a zoom condition.

19. A solid-state image capturing device according to claim 15, wherein a case where an incident angle of the chief ray changes due to some conditions is a case where the incident angle of the chief ray changes due to zoom condition.

20. A solid-state image capturing device according to claim 3, wherein different correcting coefficients are set as the correcting coefficient $a_k$ for a long edge direction and a short edge direction of the light receiving region and/or the light receiving elements.

21. A solid-state image capturing device according to claim 4, wherein different correcting coefficients are set as the correcting coefficient $a_k$ for a long edge direction and a short edge direction of the light receiving region and/or the light receiving elements.

22. A solid-state image capturing device according to claim 5, wherein different correcting coefficients are set as the correcting coefficient $a_k$ for a long edge direction and a short edge direction of the light receiving region and/or the light receiving elements.

23. A solid-state image capturing device according to claim 6, wherein different correcting coefficients are set as the correcting coefficient $a_k$ for a long edge direction and a short edge direction of the light receiving region and/or the light receiving elements.

24. A solid-state image capturing device according to claim 7, wherein different correcting coefficients are set as the correcting coefficient $a_k$ for a long edge direction and a short edge direction of the light receiving region and/or the light receiving elements.

25. A solid-state image capturing device according to claim 8, wherein different correcting coefficients are set as the correcting coefficient $a_k$ for a long edge direction and a short edge direction of the light receiving region and/or the light receiving elements.

26. A solid-state image capturing device according to claim 9, wherein different correcting coefficients are set as the correcting coefficient $a_k$ for a long edge direction and a short edge direction of the light receiving region and/or the light receiving elements.

27. A solid-state image capturing device according to claim 10, wherein different correcting coefficients are set as the correcting coefficient $a_k$ for a long edge direction and a short edge direction of the light receiving region and/or the light receiving elements.

28. A solid-state image capturing device according to claim 11, wherein different correcting coefficients are set as the correcting coefficient $a_k$ for a long edge direction and a short edge direction of the light receiving region and/or the light receiving elements.

29. A solid-state image capturing device according to claim 12, wherein different correcting coefficients are set as the correcting coefficient $a_k$ for a long edge direction and a short edge direction of the light receiving region and/or the light receiving elements.

30. A solid-state image capturing device according to claim 13, wherein different correcting coefficients are set as the correcting coefficient $a_k$ for a long edge direction and a short edge direction of the light receiving region and/or the light receiving elements.

31. A solid-state image capturing device according to claim 14, wherein different correcting coefficients are set as the correcting coefficient $a_k$ for a long edge direction and a short edge direction of the light receiving region and/or the light receiving elements.

32. A solid-state image capturing device according to claim 15, wherein different correcting coefficients are set as the correcting coefficient $a_k$ for a long edge direction and a short edge direction of the light receiving region and/or the light receiving elements.

33. A solid-state image capturing device according to claim 3, wherein different predetermined position is set as the correcting coefficient $a_k$ for a long edge direction and a short edge direction at the openings of the electrode wiring layers, the center of a pixel pitch, or the center of a photoelectric conversion device.

34. A solid-state image capturing device according to claim 4, wherein different predetermined position is set as the correcting coefficient $a_k$ for a long edge direction and a short edge direction at the openings of the electrode wiring layers, the center of a pixel pitch, or the center of a photoelectric conversion device.

35. A solid-state image capturing device according to claim 5, wherein different predetermined position is set as the correcting coefficient $a_k$ for a long edge direction and a short edge direction at the openings of the electrode wiring layers, the center of a pixel pitch, or the center of a photoelectric conversion device.

36. A solid-state image capturing device according to claim 6, wherein different predetermined position is set as the correcting coefficient $a_k$ for a long edge direction and a short edge direction at the openings of the electrode wiring layers, the center of a pixel pitch, or the center of a photoelectric conversion device.

37. A solid-state image capturing device according to claim 7, wherein different predetermined position is set as the correcting coefficient $a_k$ for a long edge direction and a short edge direction at the openings of the electrode wiring layers, the center of a pixel pitch, or the center of a photoelectric conversion device.

38. A solid-state image capturing device according to claim 8, wherein different predetermined position is set as the correcting coefficient $a_k$ for a long edge direction and a short edge direction at the openings of the electrode wiring layers, the center of a pixel pitch, or the center of a photoelectric conversion device.

39. A solid-state image capturing device according to claim 9, wherein different predetermined position is set as the correcting coefficient $a_k$ for a long edge direction and a short edge direction at the openings of the electrode wiring layers, the center of a pixel pitch, or the center of a photoelectric conversion device.

40. A solid-state image capturing device according to claim 10, wherein different predetermined position is set as the correcting coefficient $a_k$ for a long edge direction and a short edge direction at the openings of the electrode wiring layers, the center of a pixel pitch, or the center of a photoelectric conversion device.

41. A solid-state image capturing device according to claim 11, wherein different standard predetermined position is set as the correcting coefficient $a_k$ for a long edge direction and a short edge direction at the openings of the electrode wiring layers, the center of a pixel pitch, or the center of a photoelectric conversion device.

42. A solid-state image capturing device according to claim 12, wherein different predetermined position is set as the correcting coefficient $a_k$ for a long edge direction and a short edge direction at the openings of the electrode wiring layers, the center of a pixel pitch, or the center of a photoelectric conversion device.

43. A solid-state image capturing device according to claim 13, wherein different predetermined position is set as the correcting coefficient $a_k$ for a long edge direction and a short edge direction at the openings of the electrode wiring layers, the center of a pixel pitch, or the center of a photoelectric conversion device.

44. A solid-state image capturing device according to claim 14, wherein different predetermined position is set as the correcting coefficient $a_k$ for a long edge direction and a short edge direction at the openings of the electrode wiring layers, the center of a pixel pitch, or the center of a photoelectric conversion device.

45. A solid-state image capturing device according to claim 15, wherein different predetermined position is set as the correcting coefficient $a_k$ for a long edge direction and a short edge direction at the opening of the electrode wiring layers, the center of a pixel pitch, or the center of a photoelectric conversion device.

46. A solid-state image capturing device according to claim 1, wherein at least any of the openings of the electrode wiring layers, the color filters and the microlenses are shifted uniformly in relation to all of the light receiving elements or in relation to a predetermined position where a light flux is desired to pass through over the light receiving elements so as to be arranged in the light receiving region, in all the light receiving elements or in response to the repetition of the layout for the electrode wiring layers or in response to the repetition for the color filters, in addition to the shifting of the microlenses, the color filters and the openings of the electrode wiring layers in relation to the light receiving elements or in relation to a predetermined position where a light flux is desired to pass through over the light receiving elements.

47. A solid-state image capturing device according to claim 1, wherein, in a case where wavelength dependence is observed in the refractive index $n_k$ of each layer above the light receiving elements that configure the light receiving region, the shift amount of the openings of the electrode wiring layers, the color filters and the microlenses in relation to the light receiving elements or in relation to a predetermined position where a light flux is desired to pass through over the light receiving elements are changed for every wavelength or every color of the color filters in accordance with the refractive index.

48. A solid-state image capturing apparatus provided with a solid-state image capturing device according to claim 1 and an image capturing optical system in front of the solid-state image capturing device, in which light enters from the image capturing optical system to the light receiving region.

49. A solid-state image capturing apparatus according to claim 48, wherein the image capturing optical system is an aspherical lens.

50. A solid-state image capturing apparatus according to claim 48, wherein the image capturing optical system is a Fresnel lens.

51. An electronic information device using the solid-state image capturing device according to claim 1 as an image input device in an image capturing section.

52. An electronic information device using the solid-state image capturing apparatus according to claim 22 as an image input device in an image capturing section.

* * * * *